United States Patent
Spina et al.

(10) Patent No.: US 8,364,195 B2
(45) Date of Patent: Jan. 29, 2013

(54) INTEGRATED GALVANIC ISOLATOR USING WIRELESS TRANSMISSION

(75) Inventors: Nunzio Spina, Acicastello (IT); Giovanni Girlando, Gela (IT); Santo Alessandro Smerzi, Catania (IT); Giuseppe Palmisano, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 968 days.

(21) Appl. No.: 12/119,426

(22) Filed: May 12, 2008

(65) Prior Publication Data

US 2008/0311862 A1 Dec. 18, 2008

(30) Foreign Application Priority Data

May 11, 2007 (IT) ............... TO2007A0325

(51) Int. Cl.
*H04M 1/00* (2006.01)

(52) U.S. Cl. .......... 455/550.1; 455/88; 455/252.1; 307/104

(58) Field of Classification Search .......... 455/550.1, 455/88, 252.1, 562.1, 575.7, 90.3, 274, 278.1; 307/104; 336/200; 361/111, 106, 804
See application file for complete search history.

(56) References Cited

U.S. PATENT DOCUMENTS

| | | | |
|---|---|---|---|
| 5,952,849 A | 9/1999 | Haigh | |
| 6,226,331 B1 * | 5/2001 | Gambuzza | 375/258 |
| 6,937,454 B2 * | 8/2005 | Mikolajczak et al. | 361/111 |
| 7,139,528 B2 * | 11/2006 | Gambuzza | 455/41.2 |
| 7,288,940 B2 * | 10/2007 | Wynne et al. | 324/415 |
| 7,741,943 B2 * | 6/2010 | Fouquet et al. | 336/200 |
| 7,791,900 B2 * | 9/2010 | Fouquet et al. | 361/803 |
| 7,796,684 B2 * | 9/2010 | Trott | 375/219 |
| 2006/0153495 A1 * | 7/2006 | Wynne et al. | 385/22 |
| 2008/0061631 A1 * | 3/2008 | Fouquet et al. | 307/109 |
| 2008/0179963 A1 * | 7/2008 | Fouquet et al. | 307/104 |
| 2008/0198904 A1 * | 8/2008 | Chang | 375/146 |
| 2008/0278275 A1 * | 11/2008 | Fouquet et al. | 336/84 M |
| 2008/0317106 A1 * | 12/2008 | Leung et al. | 375/220 |
| 2009/0153283 A1 * | 6/2009 | Fouquet et al. | 336/200 |
| 2009/0206960 A1 * | 8/2009 | Ng et al. | 333/247 |
| 2009/0213914 A1 * | 8/2009 | Dong et al. | 375/219 |
| 2010/0020448 A1 * | 1/2010 | Ng et al. | 361/1 |
| 2010/0052826 A1 * | 3/2010 | Callahan et al. | 333/24 R |
| 2010/0148911 A1 * | 6/2010 | Fouquet et al. | 336/200 |
| 2010/0176660 A1 * | 7/2010 | Fouquet et al. | 307/109 |
| 2010/0329363 A1 * | 12/2010 | Ng et al. | 375/257 |
| 2011/0080323 A1 * | 4/2011 | Thiam et al. | 343/700 MS |
| 2011/0095620 A1 * | 4/2011 | Fouquet et al. | 307/104 |

FOREIGN PATENT DOCUMENTS

WO 2005122423 12/2005

* cited by examiner

*Primary Examiner* — Minh D Dao
(74) *Attorney, Agent, or Firm* — Graybeal Jackson LLP

(57) ABSTRACT

An embodiment of a wireless galvanic isolator device is formed by a transmitter circuit, a receiver circuit, and a wireless coupling structure, arranged between the transmitter circuit and the receiver circuit. The wireless coupling structure is formed by a pair of antennas each arranged on an own die and integrated together with the respective transmitter and receiver circuit. The two dice may be arranged adjacent to each other in a planar configuration or arranged on top of each other and bonded together.

37 Claims, 10 Drawing Sheets

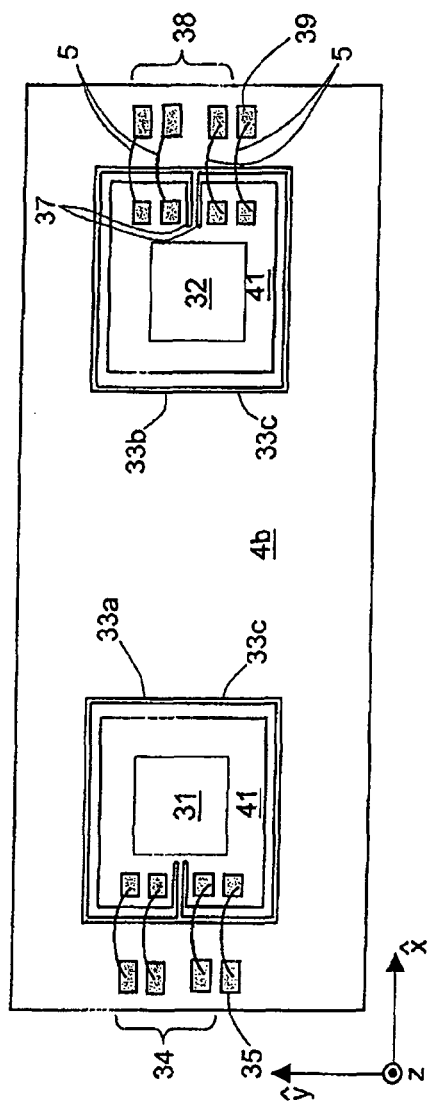
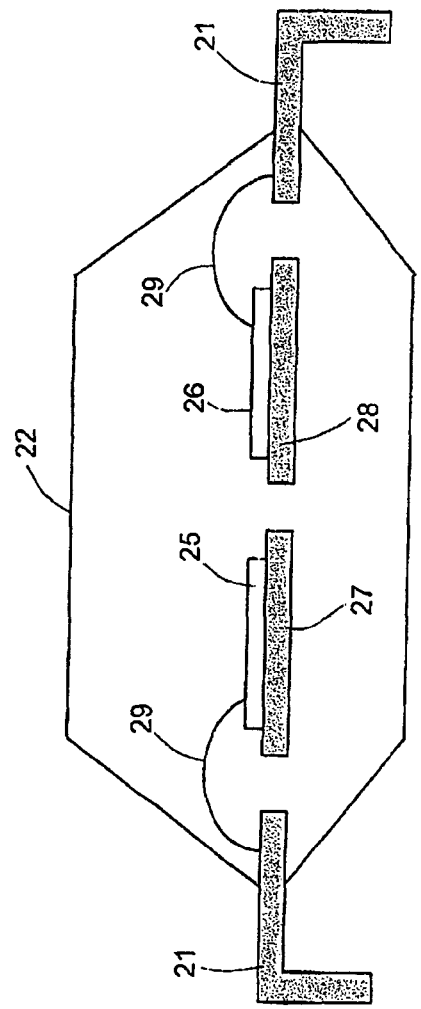

INTEGRATED GALVANIC ISOLATOR USING WIRELESS TRANSMISSION

PRIORITY CLAIM

This application claims priority from Italian patent application No. TO2007A000325, filed May 11, 2007, which is incorporated herein by reference.

TECHNICAL FIELD

An embodiment of the present disclosure relates to an integrated galvanic isolator, in particular to a galvanic isolator for the transfer of numeric signals.

BACKGROUND

As is known, integrated isolators are today divided into three main classes. The first class includes optical couplers, which use a LED-phototransistor pair for performing a double electro-optical conversion. Some problems linked to this class of devices are due to the low efficiency of the fabrication process and to the limited bit rate that can be achieved, given the signal conversion, mentioned above, from the optical domain to electrical one, and vice versa.

Belonging to the second class are devices with a capacitive interface, wherein a pair of capacitors transfer the electrical signal; these devices are characterized by a galvanic isolation typically of approximately 10 kV. The devices with capacitive interface may be limited by a reduced immunity to common-mode voltage transients.

The third class comprises devices using transformers.

A device 30 of this type is shown in FIG. 1. The device 30 comprises three distinct silicon dice, 7a, 7b and 7c, housing, respectively, a transmitter circuit I, a receiver circuit 2, and a transformer 3, formed by a primary stage 3a and a secondary stage 3b insulated from one another, as described hereinafter. The device 30 is assembled in a single package 6, represented only schematically, comprising a moulding compound 4, having high dielectric strength so as to insulate the dice 7a-7c from one another.

The transmitter circuit/embedded in the first die 7a has the purpose of processing a data signal supplied on input pins and to be transmitted to the primary stage 3a of the transformer 3. The transmitter circuit/is coupled to the primary stage 3 via first connection wires 5a. The secondary stage 3b is coupled via second connection wires 5b to the third die 7c embedding the receiver circuit 2. In the example considered, the primary stage 3a is formed by depositing a layer of gold above the moulding compound 4; the secondary stage 3b is formed in the top metal layer provided for in a CMOS fabrication process. The transmitter circuit/and the receiver circuit 2 operate typically in base-band and thus enable transmission of only one data channel.

The known device described above may require some constructional post-processing steps to provide the primary stage 3a and the secondary stage 3b of the transformer 3, which may entail a high cost of the device.

In addition, none of the devices mentioned above enables a proper radiofrequency wireless transmission, and they require complex structures or wires for connection of different parts of the device.

SUMMARY

An embodiment of the present disclosure provides an integrated galvanic isolator that solves problems of known devices and, in particular, may not require constructional post-processing steps or wires for connection of the various parts.

BRIEF DESCRIPTION OF THE DRAWINGS

One or more embodiments of the disclosure are now described, purely by way of non-limiting example with reference to the attached drawings, wherein:

FIG. 3 shows a top plan view of a first embodiment of the present device;

FIG. 4 shows a cross-section of the device of FIG. 3, after packaging;

FIG. 14 shows the block diagram of a variant of the circuits of FIG. 8a; and

Figure 1:
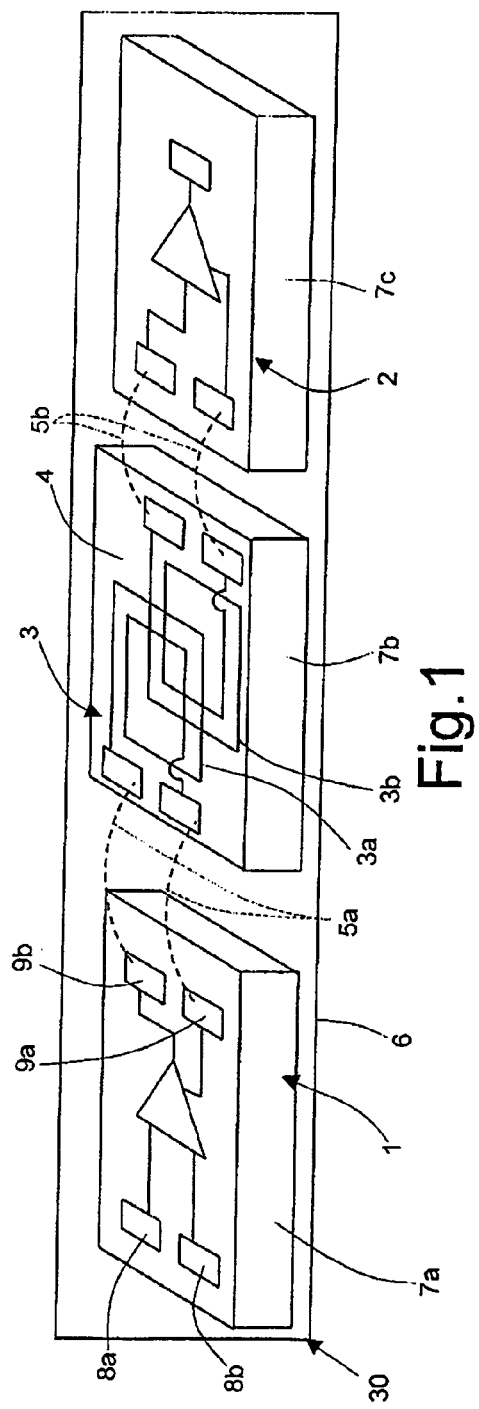
FIG. 1 shows a block diagram of a known integrated galvanic isolator device.
Figure 2:
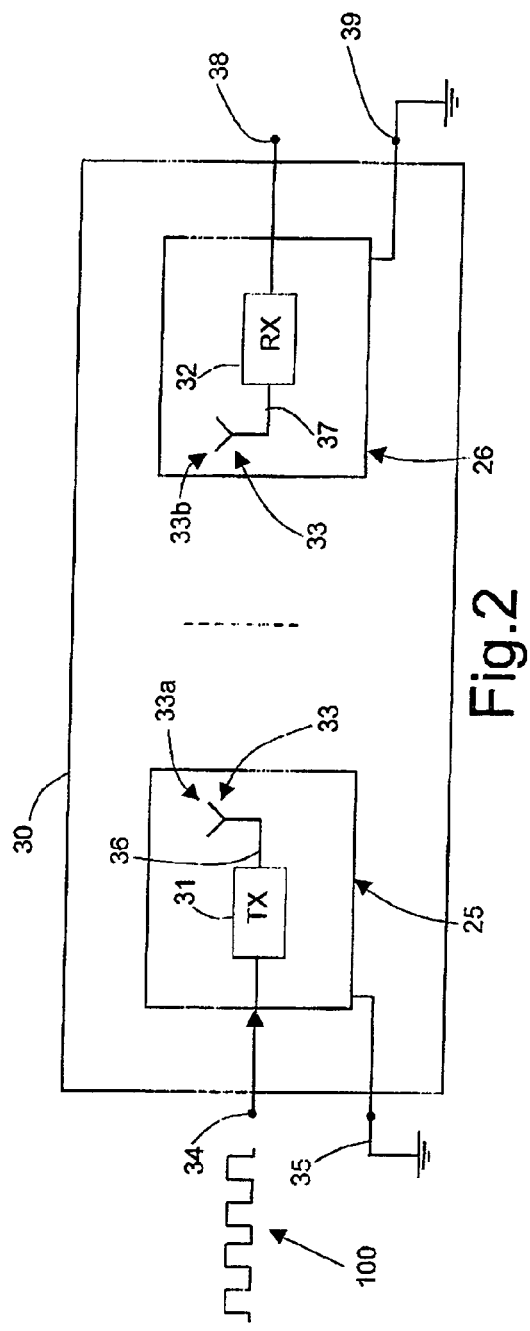
FIG. 2 shows a working block diagram of an embodiment of the present integrated galvanic isolator device.

According to FIG. 2, a galvanic isolator 30 comprises a first die 25 and a second die 26. The first die 25 accommodates a transmitter circuit 31 and a transmitting antenna 33a; the second die 26 accommodates a receiver circuit 32 and a receiving antenna 33b.

The transmitter circuit 31 comprises a data input 34, receiving an input signal 100, a reference input 35, coupled to a ground potential, and an output 36, coupled to the transmitting antenna 33a. The transmitter circuit 31 processes the input signal 100, translates it into radiofrequency and supplies it to the transmitting antenna 33a.

The receiving antenna 33b is coupled to the transmitting antenna 33a and is coupled to an input 37 of the receiver circuit 32, which processes the signal received, translates it into base-band and supplies it to an output 38. The receiver circuit 32 moreover has a reference terminal 39, coupled to a ground potential which may be different from the ground potential to which the transmitter circuit 31 is coupled.

The transmitting and receiving antennas 33a, 33b may be formed by dipoles, bent dipoles, or loop antennas. The transmitting and receiving antennas 33a, 33b generate a near-field or far-field electromagnetic coupling according to the operating conditions, i.e., according to the ratio between the wavelength and the distance between the two antennas, i.e., the transmitting antenna 33a and the receiving antenna 33b. In fact, on the hypothesis that:

$$r \gg \lambda$$

$$r \gg D$$

$$r > \frac{2D^2}{\lambda}$$

where r is the distance between the two antennas, D is the largest dimension of the radiant parts of the antennas 33a, 33b, and λ is the wavelength of the radiofrequency signal, the antennas 33a, 33b operate in far-field conditions, otherwise they operate in near-field conditions. In this connection see: Antenna Theory, Constantine A. Balanis, 2nd Ed. John Wiley & Sons. Inc., Chapters 4 and 5, this reference being incorporated herein in its entirely.

According to a first embodiment (illustrated in FIGS. 3 and 4), the first die 25 and the second die 26 are mounted in a planar way on separate leadframes 27, 28 and are packaged in a package 22, formed by a moulding compound. Pins 21 are coupled to the transmitter circuit 31 and receiver circuit 32 through bonding wires 29.

In the considered embodiment, the transmitting and receiving antennas 33a, 33b have a square-loop shape, are mounted on a same plane and surround, respectively, active areas, integrating, respectively, the transmitter circuit 31 and the receiver circuit 32, as shown in FIG. 3.

The embodiment of FIGS. 3, 4 enables a good rejection to common-mode voltages to be obtained at the expense of a certain path loss. In fact, as is known, according to the length of the mutually facing sides 33c of the antennas 33a and 33b, the radiation diagram of the antennas 33a, 33b has a maximum directivity that may not be oriented along the axis x of alignment of the antennas 33a, 33b.

Instead, the common-mode coupling is directly proportional to the coupling capacity of the antennas. As is known, the coupling capacity is proportional to the common area of the two plates of a capacitor, here formed by the area of the mutually facing sides 33c, of very small dimensions.

In the embodiment of FIGS. 3 and 4, the distance between the antennas 33a and 33b is approximately 1 mm, which enables a galvanic isolation of the order of 10 kV, much greater than that of current transformer-isolated devices (typically 6 kV).

In simulations of the device of FIGS. 3-4 in BCD (Bipolar-CMOS-DMOS) technology, characterized by a natural cut-off of 22 GHz, with a frequency of simulation of the radiofrequency signal supplied to the receiving antenna of 1 GHz, a path loss of between 43 and 45 dB and a common-mode rejection ratio (CMRR) of 80 kV/μs were obtained.

Figure 5:
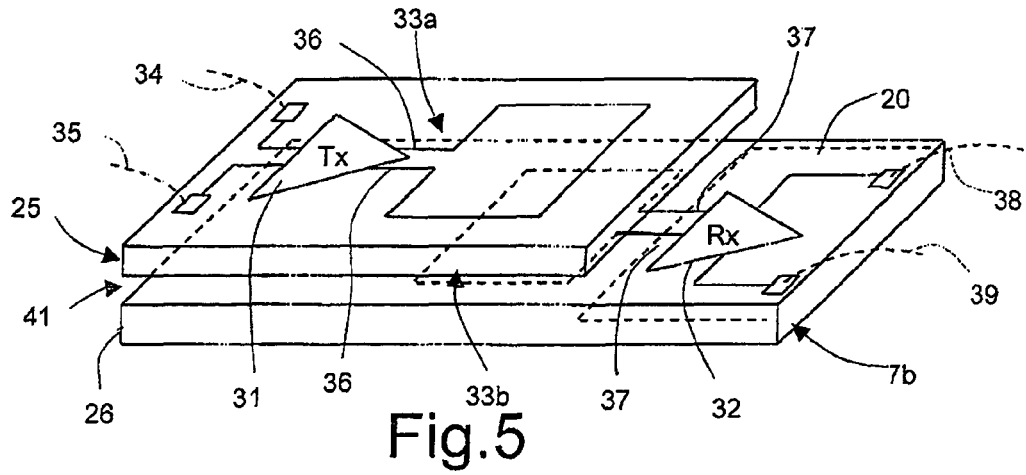
FIG. 5 shows a perspective view of a second embodiment of the present device.
Figure 6:
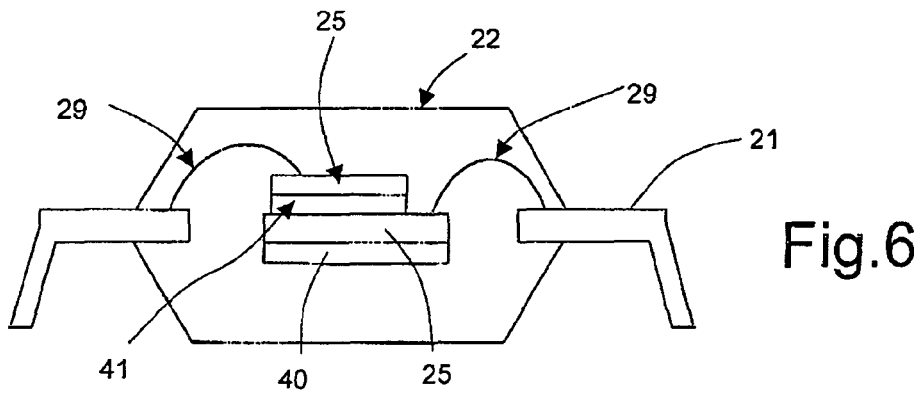
FIG. 6 shows a cross-section of the device of FIG. 5, after packaging.
Figure 7:
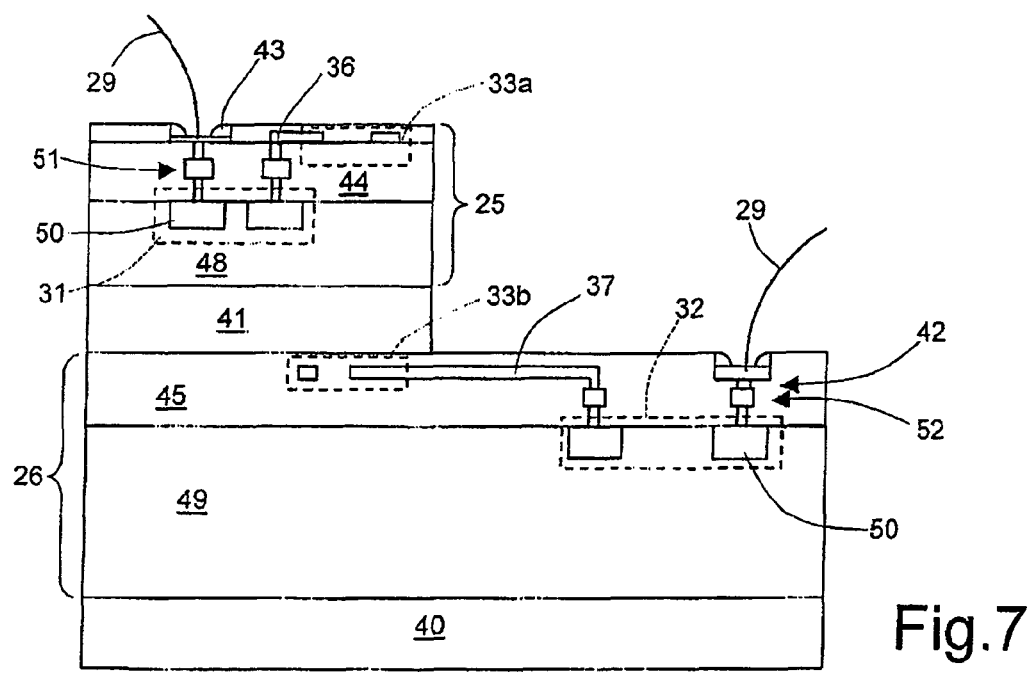
FIG. 7 shows an enlarged cross-section of the device of FIG. 5.

FIGS. 5-7 show an embodiment of a stacked type. In detail, the first die 25 is mounted on top of the second die 26, with the transmitting antenna 33a arranged on top of the receiving antenna 33b. In this embodiment, as may be seen in particular in FIG. 6, a single leadframe 40 carries both the dice 25, 26. In addition, the same FIG. 6 shows also the connection of the dice 25, 26 to the external pins 21 of the package 22.

In detail, the dice 25, 26 comprise a respective substrate 48, 49, of semiconductor material, accommodating regions 50 with different types of conductivity, forming the transmitter circuit 31 and receiver circuit 32. Respective passivation regions 44 and 45 extend on top of the substrates 48, 49 and accommodate different metal levels, which form electrical connections and the antennas 33a, 33b. For simplicity, FIG. 7 shows only a bottom metal level 51, 52 forming electrical-connection regions, and a top metal layer 42, 43, forming, into alia, the transmitting antenna 33a and receiving antenna 33b.

The two dice 25, 26 are bonded and isolated from one another via an isolating layer 41, arranged between the passivation region 45 of the second die 26 and the substrate 48 of the first die 25. In practice, the first die 25 overlies the second die 26, and the latter is fixed to the leadframe 40.

The second die 26 may have a greater thickness than the first die 25a; for example, the first die 25 may have a thickness of approximately 150 μm, the second die 26 may have a thickness of approximately 500 μm, and the isolating layer 41 may have a thickness of approximately 300 μm.

In the embodiment of FIGS. 5-7, the receiver circuit 32 is formed in an area of the second die 26 set back with respect to the first die 25 so as to ease the formation of the connection wires 29 and prevent overheating phenomena.

In the embodiment of FIGS. 5-7, the antennas 33a and 33b face one another so that, even though they have a greater parasitic capacitance than in the embodiment of FIGS. 3 and 4, they enable a much lower path loss, due by the small thickness of the isolating layer 41. This embodiment may then be subject to a greater sensitivity to common-mode voltage transients.

The arrangement shown enables a simple bonding of the dice 25, 26, as well as a simple accessibility by the connection wires 29 to the terminals forming the data input 34, the ground terminal 35, and the output terminal 38 of the transmitter circuit 31 and of the receiver circuit 32.

As may be noted clearly in FIG. 7, the presence of connection wires 29 is only necessary for connecting the data input 34, the ground terminals 35 and output terminals 38, 39 to the outside world, while no connection wire is used for connecting the two dice 25, 26.

With the circuit of FIGS. 5-7, a good matching may be obtained between the transmitter circuit 31 and the transmitting antenna 33a. In fact, if the transmitter circuit 31 is represented as a quadrupole having two ports (inputs 34, and outputs 37), by designating with b1 and b2 the progressive waves in these ports and with a1 and a2 the regressive waves in these ports, the scattering matrix is defined as:

$$\begin{bmatrix} b1 \\ b2 \end{bmatrix} = \begin{bmatrix} S11 & S12 \\ S21 & S22 \end{bmatrix} \begin{bmatrix} a1 \\ a2 \end{bmatrix}$$

where S11, S12, S21, and S22 are scattering parameters. As is known, S11, defined as the ratio between b1 and a1 calculated with a2=0, i.e., with load adapted on the second port, determines the coefficient of reflection on the first port of the quadrupole. A low value of S11 implies that the transmitting antenna 33a is well designed and protects the transmitter circuit 31 from possible damage deriving from reflections of radiofrequency signal transmitted by the transmitting antenna 33a. In the described embodiment, the measured scattering parameter S11 is approximately equal to −33 dB.

The integrated galvanic isolators 30 shown in FIGS. 2-7 may operate in monochannel or multichannel mode with single interface, using a particular modulation and demodulation, as described in detail hereinafter.

Figure 8:
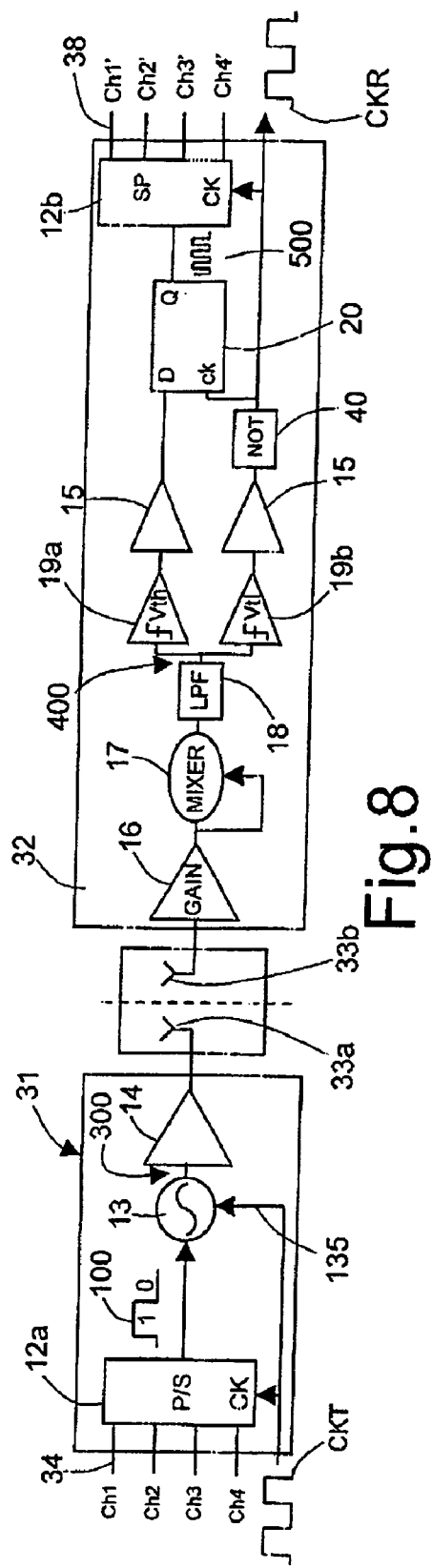
FIG. 8 shows a block diagram of the transmitter circuit and of the receiver circuit of an embodiment of the present device.

In particular, FIG. 8 shows an embodiment wherein an OOK (On-Off Keying) modulation technique is used, with different amplitudes of the signal transmitted. In detail, the transmitter circuit 31 comprises a plurality of data inputs 34, each of which receives a respective input channel Ch1-Ch4 and which are coupled to a parallel-to-serial converter 12a, in turn receiving a first clock signal CKT. The output of the parallel-to-serial converter 12a supplies a data signal 100 to an RF oscillator 13, which also receives the clock signal CKT and outputs a radiofrequency signal 300, the amplitude whereof depends both upon the logic value of the first clock signal CKT and upon the logic value of the signal 100. In particular, when the first clock signal CKT is at the logic level 1, the radiofrequency signal 300 has a first amplitude Vh, when the data signal 100 has a logic level equal to 1, and a second amplitude Vl, when the data signal 100 has a logic level equal to 0. When the first clock signal CKT is at the logic level 0, the RF oscillator 13 is deactivated and does not produce any signal.

Figure 9:
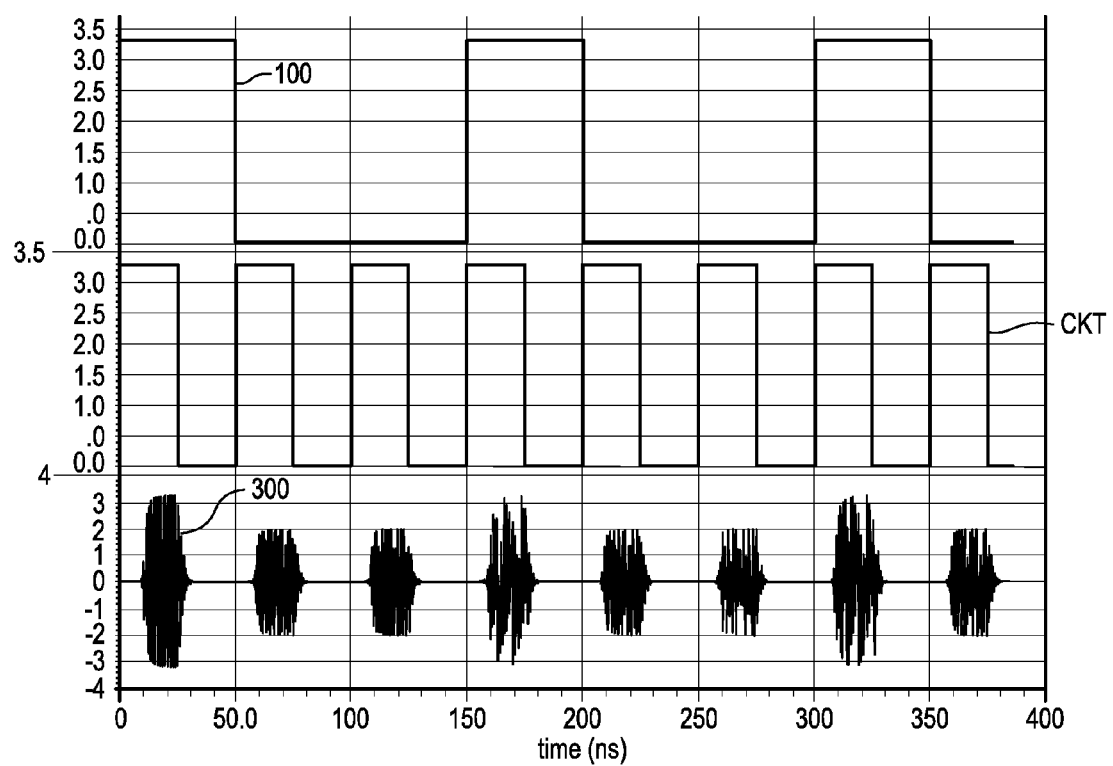
FIG. 9 shows simulated waveforms that may be obtained with the transmitter and receiver circuits of FIG. 8.

For example, the logic level 1 of the data signal 100 may be associated with an amplitude of the radiofrequency signal 300 approximately equal to 6 Vpp, while the logic level 0 may be associated with an amplitude of the radiofrequency signal 300 approximately equal to 4 Vpp. FIG. 9 shows a set of simulated waveforms that may thus be obtained.

The radiofrequency signal 300 is then supplied to a first buffer 14 for adapting the radiofrequency signal 300 to the antenna 33a.

Figure 11:
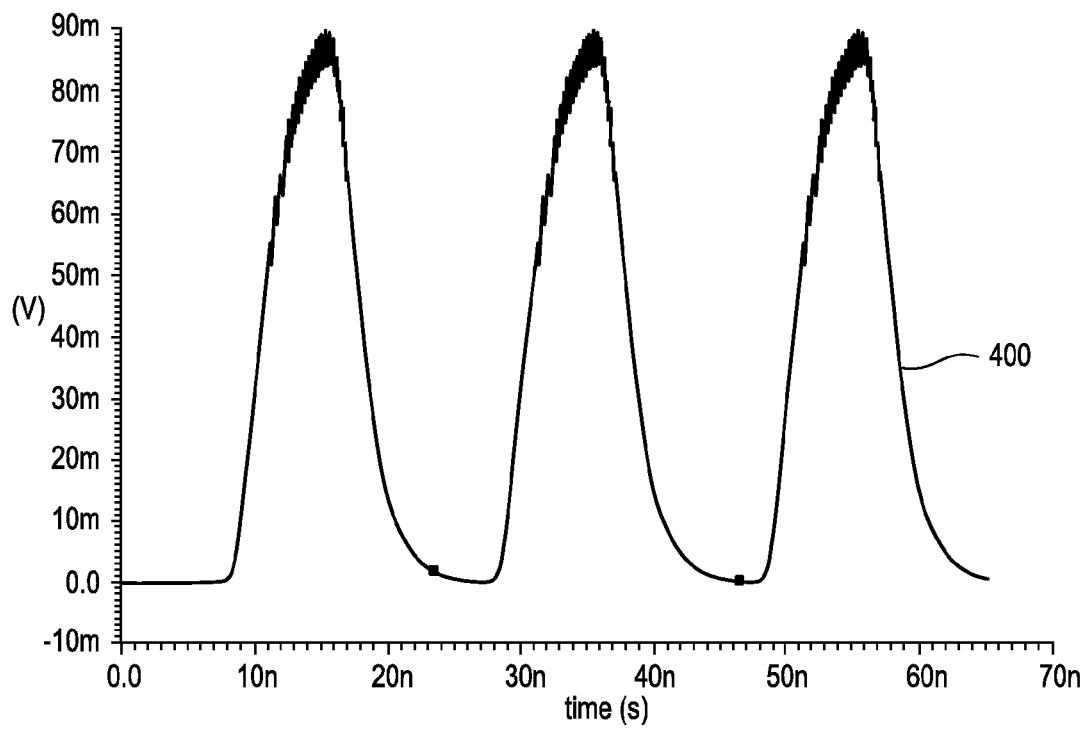
FIGS. 11 and 12 show an envelope of two signals generated by the transmitter and receiver circuits of FIG. 8.
Figure 12:
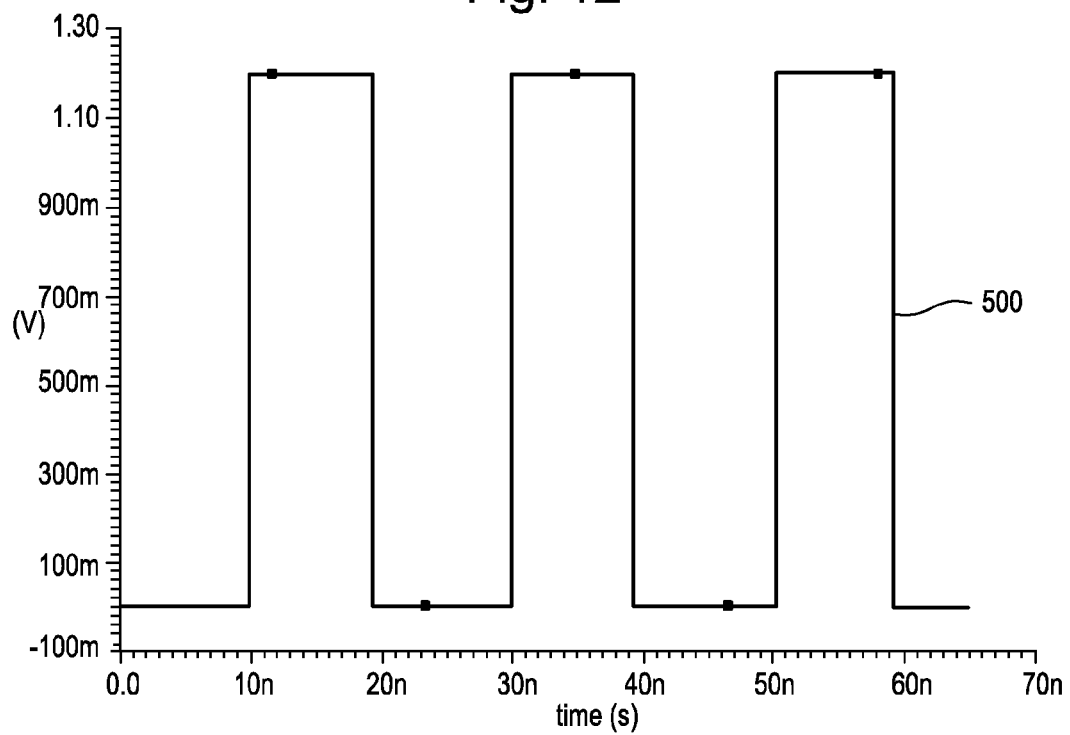

The receiving antenna 33b is coupled to an amplifier stage 16 belonging to the receiver circuit 32 and coupled to a mixer stage 17. In turn, the mixer stage 17 is coupled to a RC-type, lowpass filter 18, which eliminates the double-frequency components generated by the mixer stage 17, outputting an envelope signal 400, shown as an example in FIG. 11.

The envelope signal 400 is then squared by a first and a second trigger circuits 19a, 19b operating so as to output respective signals, the logic level whereof is 1 only if the signal at their inputs exceeds a respective threshold voltage Vth, Vtl, which are different from one another and are linked to a respective amplitude of the radiofrequency signal 300.

In detail, for the first trigger circuit 19a we have:

$$Vth \leq Vh \pm Vn$$

where Vth is the threshold voltage of the first trigger circuit 19a, Vh is the first amplitude of the radiofrequency signal 300, and Vn is a noise component.

The second trigger circuit 19b has a threshold voltage Vtl, which is linked to the second amplitude Vl of the radiofrequency signal 300. In this case:

$$Vtl \geq Vl \pm Vn$$

where Vl is the second amplitude of the radiofrequency signal 300, and Vn the noise component.

In practice, the signal generated by the second trigger circuit 19b is a delayed replica of the first clock signal CKT.

Figure 10:
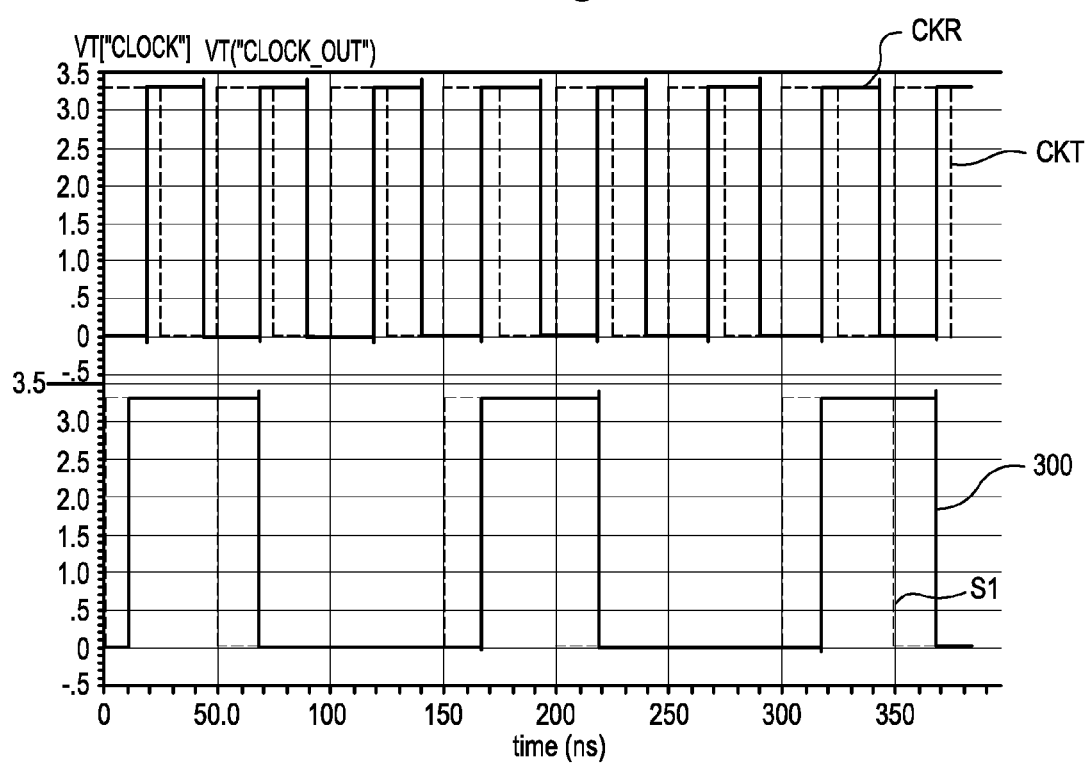
FIG. 10 shows the waveforms that may be obtained with the circuit 8, where the corresponding delays are highlighted.

The output signals of the trigger circuits 19a, 19b are supplied to a second buffer 15 and from this to a D flip-flop (DFF) 20, which outputs a reconstructed signal 500, supplied to a serial-to-parallel converter 12b, synchronized with the replica of the second clock signal CKT extracted from the second trigger circuit 19b. A chain of inverters 40 delays the signal at output of the second trigger circuit 19b by approximately 2 ns with respect to the signal at output of the first trigger circuit 19a. Thereby, this allows that, during the rising edge of the clock input CK of the flip-flop 20, the input D sees the correct logic level to be outputted. FIG. 10 shows the delays between the clock signal CKR and a signal S1 at the output of the first trigger circuit 19a.

The serial-to-parallel converter 12b then divides the data in serial format so as to obtain a plurality of output channels Ch1'-Ch4', which are transferred to the outside of the circuit via the output 38. The format of the output channels Ch1'-Ch4' may be identical to the format of the input channels Ch1-Ch4, apart from the temporal translation given by the propagation and processing delays.

The embodiment shown in FIG. 8 is particularly inexpensive since it enables the transmitter circuit 31 and the receiver circuit 32 to be the same for all the channels, thus avoiding a major expenditure in terms of semiconductor area, as well as in terms of dissipated electric power. According to some simulations made in the same operating conditions as the ones indicated with reference to FIGS. 5-7, the embodiment of FIG. 8 has a path loss of approximately 26 dB.

Figure 13:
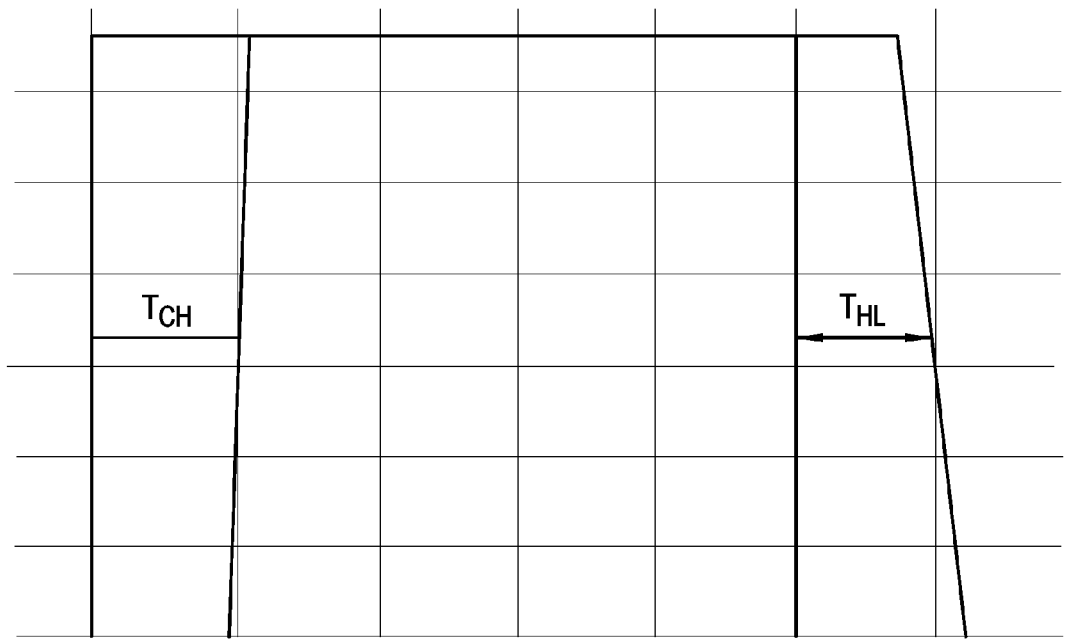
FIG. 13 shows an evolution of pulses generated by the transmitter and receiver circuits of FIG. 8.

FIG. 13 shows the pulse distortion diagram, showing the differences between a pulse of one of the input channels Ch1-Ch4 and a pulse of one of the output channels Ch1'-Ch4'.

As may be noted, the pulse distortion, defined as $$PD = |T_{LH} - T_{HL}|,$$

where $T_{LH}$ is the pulse delay of the reconstructed signal 500 with respect to the data signal 100 during a transition from the logic level 0 to the logic level 1, while $T_{HL}$ is the pulse delay of the reconstructed signal 500 with respect to the data signal 100 during a transition from the logic level 1 to the logic level 0 $T_{LH}$ and $T_{HL}$ are comprised between approximately 0.5 and 1 ns.

Figure 14:
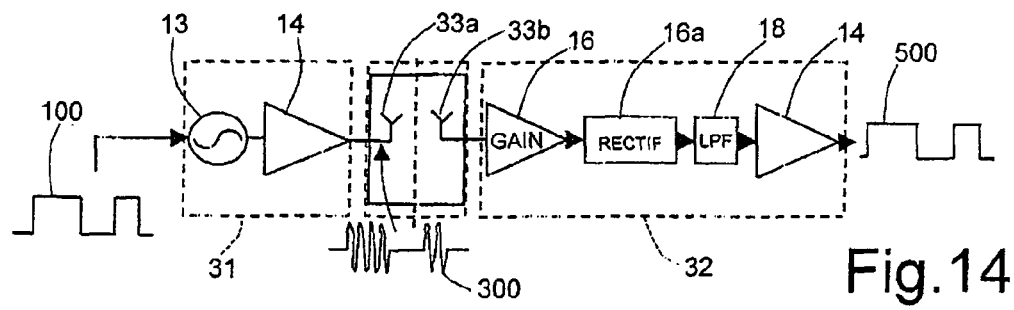

FIG. 14 shows an embodiment of a galvanic isolator 30 having just one transmission channel that uses a pure OOK modulation. In FIG. 14, the RF oscillator 13 is directly coupled to the input 34 and generates an output signal 300 of sinusoidal type having a first fixed amplitude when the input signal 100 is at the logic level 1 and a zero amplitude when the input signal 100 is at the logic level 0. Analogously to FIG. 8, the radiofrequency signal 300 is supplied to the transmitting antenna 33a, transmitted to the antenna 33b, and supplied to the receiver circuit 32. Here, the received signal is amplified by the amplifier stage 16, rectified by the rectification circuit 16a (which forms the mixer 17 of FIG. 8) and subsequently filtered by the RC-type lowpass filter 18, to obtain the envelope signal 400, supplied to the second buffer 14.

Figure 15:
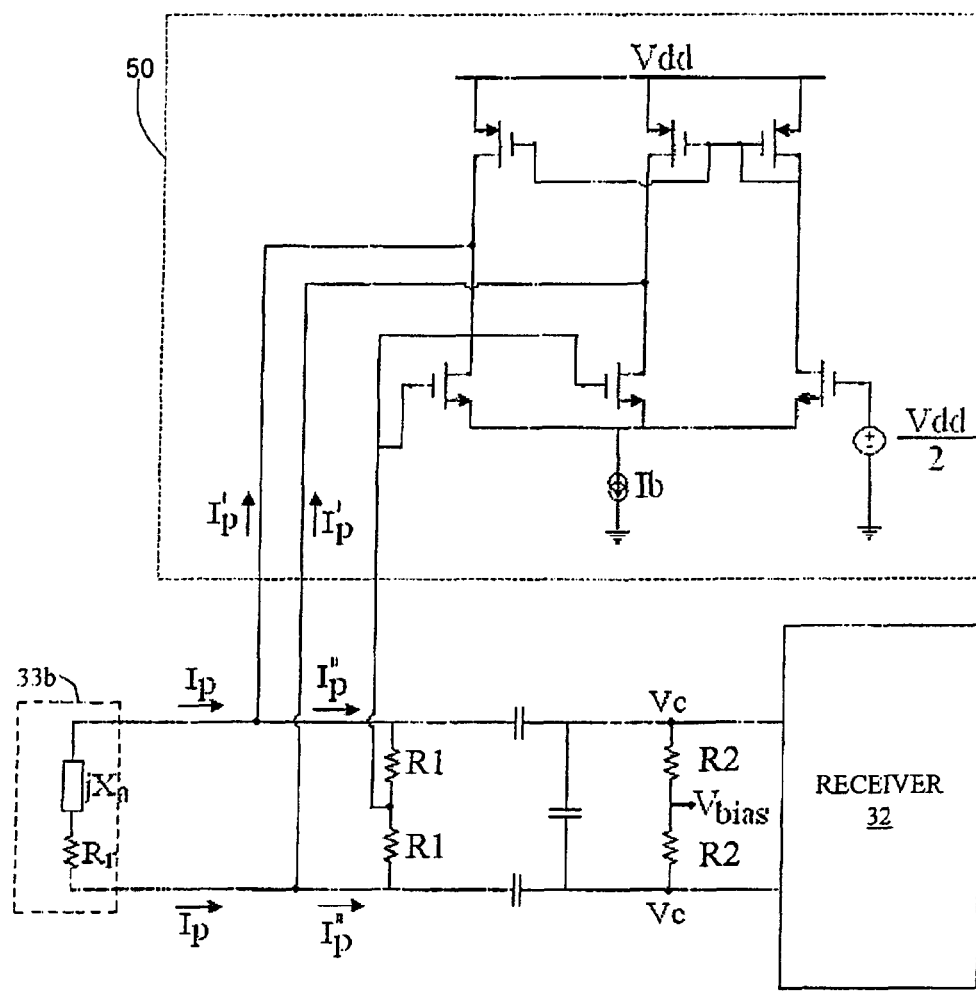
FIG. 15 shows a variant of the device, including a circuit for reducing common-mode disturbance.

FIG. 15 shows a variant of the circuit of FIG. 8. In the solution of FIG. 15, a protection circuit 50 is arranged between the receiving antenna 33b and the receiver circuit 32 in order to improve further the characteristics of common-mode rejection.

The embodiment shown in FIG. 15, as regards the RF part, uses differential signals for the purpose of strengthening the device against disturbance of different nature that may arise. In near-field conditions, on account of any parasitic electrical coupling between the two antennas 33a, 33b, any common-mode voltage transients on the transmitter circuit 31 may give rise, at input to the receiver circuit 32, a common-mode current, which, in particular operating conditions, may alter the biasing of the amplifier stage 16.

In fact, the common-mode voltage transient (dV/dt) in the transmitter circuit 31 with respect to the receiver circuit 32 produces a parasitic current Ip, proportional to the parasitic electrical coupling, which is equal to:

$$Ip = C \frac{dV}{dt}$$

where C is the parasitic capacitance between the two antennas.

As is shown in FIG. 15, the parasitic current Ip produces a voltage drop ΔV across each resistance R and consequently the voltage Vc is not equal to the desired voltage Vbias. Thus, the parasitic current Ip can cause failure in correct demodulation of the useful signal in the receiver. To strengthen the device against voltage transients, it is proposed to use an additional circuit in feedback configuration, which has a further protective function of the receiver circuit 32. According to FIG. 15, Ip is the total parasitic current, while Ip' the Ip" are, respectively, the part of current that flows in the protection circuit and the part of current that, instead, flows towards the receiver circuit 32, altering the biasing thereof.

The protection circuit 50 is sized so that, in the presence of very intense common-mode transients (for example, 50 kV/µs), the following condition is verified:

$$Ip \approx Ip'$$

While $$Ip'' = 0$$

Consequently, in the receiving antenna 33b, the parasitic common-mode current no longer flows to the receiver. This current is instead "captured" in a more or less high percentage (depending upon the sizing of the components of the circuit shown in FIG. 15 and the degree of the common-mode transients) by the protection circuit. By appropriately sizing the biasing current of this circuit, it may be possible to obtain characteristics in terms of higher CMRRs with respect to the ones that would be obtained otherwise.

The solution proposed in FIG. 15 may be particularly useful when the silicon dice are mounted in a stacked configuration.

Advantages of the described isolator are clarified hereinafter. In particular, an embodiment of the galvanic isolator described above may be formed using process steps per se known, without requiring particular steps after forming the passivation region 44 and 45 or after forming the top metal level.

In addition, an embodiment of the described galvanic isolator 30 provides a radiofrequency structure for multichannel wireless transfer of data, characterized by a high transceiving rate and by a single interface, and thus not costly and highly reliable.

Finally, it is evident that modifications and variations can be made to the described embodiments of the galvanic isolator 30, without departing from the spirit and scope of the present disclosure. In particular, the components of the transmitter circuit 31 and receiver circuit 32 may vary with respect to what illustrated; for example, the type of filter used may be different. In addition, in the embodiment illustrated in FIGS. 5-7, the mutual arrangement of the dice 25, 26 may be reversed. Finally, even though the shown configurations refer to unidirectional transmission, the galvanic isolator may be readily adapted so as to also operate in conditions of bidirectional transmission.

In another embodiment, the transmitter, transmit antenna, receiver, and receive antenna may be disposed on a same die.

Furthermore, the transmit/receive device may be coupled to another IC, such as a controller, to form a system.

Moreover, although described as binary signals, the signals input to the transmitter and output from the receiver may be other than binary signals.

What is claimed is:

1. A wireless galvanic-isolator device comprising:
   a transmitter circuit;
   a receiver circuit; and
   a wireless coupling circuit arranged between said transmitter circuit and said receiver circuit, wherein said wireless coupling circuit includes an antenna;
   wherein the antenna is formed by a transmitting antenna and a receiving antenna; said transmitter circuit and said transmitting antenna being integrated in a first die; said receiver circuit and said receiving antenna being integrated in a second die; said first and second dice being encapsulated in a single package; and
   wherein the transmitter circuit and the receiver circuit are arranged on top of one another and galvanically isolated from one another by an isolating layer, arranged between said first and second dice.

2. The device according to claim 1, wherein the first and second dice are arranged adjacent to each other and lie on a same plane.

3. The device according to claim 2, wherein said first and second dice are carried by separate supporting structures and each comprise an active area integrating said transmitter circuit and, respectively, said receiver circuit; said transmitting antenna and said receiving antenna surrounding a respective active area.

4. The device according to claim 1, wherein
   said transmitter circuit comprises a data input configured to receive an input signal and an on-off modulation stage connected between said data input and said transmitting antenna; and
   said receiver circuit comprises a data output and a demodulation stage connected between said receiving antenna and said data output.

5. The device according to claim 1, wherein said transmitting antenna and said receiving antenna operate in near-field conditions.

6. The device according to claim 1, wherein said transmitting antenna and said receiving antenna operate in far-field conditions.

7. The device according to claim 1, wherein said transmitting antenna and said receiving antenna comprise one of a group including dipole antennas, bent-dipole antennas, loop antennas.

8. The device according to claim 1, wherein a protection circuit is coupled to an intermediate node between said receiving antenna and said receiver circuit, said protection circuit having current-subtraction means increasing rejection of the receiver circuit to common-mode noise.

9. A wireless galvanic-isolator device comprising:
   a transmitter circuit;
   a receiver circuit; and
   a wireless coupling circuit arranged between said transmitter circuit and said receiver circuit, wherein said wireless coupling circuit includes an antenna;
   wherein the antenna is formed by a transmitting antenna and a receiving antenna; said transmitter circuit and said transmitting antenna being integrated in a first die; said receiver circuit and said receiving antenna being integrated in a second die; said first and second dice being encapsulated in a single package;
   wherein the first and second dice are arranged on top of one another and galvanically isolated from one another by an isolating layer, arranged between said first and second dice; and
   wherein said first and second dice each comprise a semiconductor material substrate and a passivation region, the semiconductor material substrates of said first and second dice integrating, respectively, said transmitter circuit and said receiver circuit, said transmitting antenna and receiving antenna being formed in a top metal layer within the passivation region of said first die and of said second die, respectively.

10. The device according to the claim 9, wherein an isolating layer is arranged between said passivation region of said second die and said semiconductor material substrate of said first die.

11. A wireless galvanic-isolator device comprising:
a transmitter circuit;
a receiver circuit; and
a wireless coupling circuit arranged between said transmitter circuit and said receiver circuit, wherein said wireless coupling circuit includes an antenna;
wherein the antenna is formed by a transmitting antenna and a receiving antenna; said transmitter circuit and said transmitting antenna being integrated in a first die; said receiver circuit and said receiving antenna being integrated in a second die; said first and second dice being encapsulated in a single package;
wherein the first and second dice are arranged on to of one another and galvanically isolated from one another by an isolating layer, arranged between said first and second dice;
wherein said transmitter circuit comprises a data input configured to receive an input signal and an on-off modulation stage connected between said data input and said transmitting antenna and said receiver circuit comprises a data output and a demodulation stage connected between said receiving antenna and said data output; and
wherein said input signal comprises a first logic level and a second logic level, and said on-off modulation stage generates a radiofrequency signal comprising a first amplitude and a second amplitude associated, respectively, with said first and said second logic levels of said input signal.

12. The device according to claim 11, wherein said input signal comprises a plurality of channel signals, and said on-off modulation stage comprises a parallel-to-serial converter configured to receive said plurality of channel signals and a first clock signal and has an output connected to an RF oscillator; said RF oscillator further configured to receive said first transmission clock signal and having an output coupled to a first buffer circuit; said first buffer circuit having an output coupled to said transmitting antenna.

13. The device according to claim 12, wherein said demodulation stage comprises a mixer stage connected to said receiving antenna and having an output coupled to a lowpass filter; said lowpass filter having an output coupled to a first trigger circuit and a second trigger circuit; said first trigger circuit having an own threshold voltage, correlated to the first amplitude of the radiofrequency signal, and said second trigger circuit having an own threshold voltage correlated to the second amplitude of the radiofrequency signal, said first and second trigger circuit being coupled to said data output through a serial-to-parallel converter.

14. The device according to claim 13, wherein said second amplitude is smaller than said first amplitude and said second trigger circuit outputs a second clock signal supplied to said serial-to-parallel converter.

15. The device according to claim 13, wherein said first trigger circuit and said second trigger circuit have respective outputs coupled to a data input and a timing input of a synchronization stage, which is arranged between said first and said second trigger circuits and said parallel-to-serial converter.

16. An integrated circuit, comprising:
a first die;
a transmitter disposed on the first die;
a transmit antenna disposed on the first die and coupled to the transmitter;
a second die;
a receiver disposed on the second die, wherein at least a portion of the receiver is disposed on top of at least a portion of the transmitter;
a receive antenna disposed on the second die; and
an isolator disposed between the first die and the second die.

17. The integrated circuit of claim 16, further comprising:
a package; and
wherein the first and second dies are disposed within the package.

18. The integrated circuit of claim 16 wherein one of the first and second dies is disposed over the other of the first and second dies.

19. The integrated circuit of claim 16 wherein the first die is disposed adjacent to the second die with the isolator between the adjacent first and second dies.

20. The integrated circuit of claim 16 wherein the transmit antenna has substantially the same shape as the receive antenna.

21. The integrated circuit of claim 16 wherein the transmit and receive antennas are each substantially planar.

22. The integrated circuit of claim 16 wherein:
the transmit antenna has a transmit frequency band in which the gain of the transmit antenna ranges from a maximum transmit gain to a lower transmit gain that is an amount less than the maximum transmit gain; and
the receive antenna has a receive frequency band in which the gain of the receive antenna ranges from a maximum receive gain to a lower receive gain that is substantially the amount less than the maximum receive gain, the receive frequency band overlapping the transmit frequency band.

23. The integrated circuit of claim 16 wherein:
the transmit antenna has a transmit frequency band in which the gain of the transmit antenna ranges from a maximum transmit gain to a lower transmit gain that is an amount less than the maximum transmit gain; and
the receive antenna has a receive frequency band in which the gain of the receive antenna ranges from a maximum receive gain to a lower receive gain that is substantially the amount less than the maximum receive gain, the receive frequency band being substantially the same as the transmit frequency band.

24. The integrated circuit of claim 16 wherein the second integrated circuit comprises a common-mode-rejection circuit coupled to the receiver and operable to increase a common-mode-rejection ratio of the receiver.

25. The integrated circuit of claim 16 wherein the first die is spaced from the second die.

26. A system, comprising:
a first integrated circuit, comprising
a first die,
a transmitter disposed on the first die,
a transmit antenna disposed on the first die and coupled to the transmitter,
a second die,
a receiver disposed on the second die, and
a receive antenna disposed on the second die; and
a second integrated circuit coupled to the first integrated circuit;
wherein the transmitter and receiver are arranged on top of one another and galvanically isolated from one another by an isolating layer arranged between the first die and the second die.

27. The system of claim 26 wherein the second integrated circuit comprises a controller.

28. The system of claim 26 wherein the second integrated circuit is disposed on one of the first and second dies.

29. A system, comprising:
a first integrated circuit, comprising
  a first die,
  a transmitter disposed on the first die,
  a transmit antenna disposed on the first die and coupled to the transmitter,
  a second die,
  a receiver disposed on the second die, and
  a receive antenna disposed on the second die; and
a second integrated circuit coupled to the first integrated circuit;
wherein the first die and the second die are arranged on to of one another and galvanically isolated from one another by an isolating layer arranged between the first die and the second die; and
wherein the second integrated circuit is disposed on a third die.

30. A system, comprising:
a first integrated circuit, comprising
  a first die,
  a transmitter disposed on the first die,
  a transmit antenna disposed on the first die and coupled to the transmitter,
  a second die,
  a receiver disposed on the second die, and
  a receive antenna disposed on the second die; and
a second integrated circuit coupled to the first integrated circuit;
wherein the first die and the second die are arranged on top of one another and galvanically isolated from one another by an isolating layer arranged between the first die and the second die; and
wherein the first integrated circuit comprises a first package within which the first and second dies are disposed; and
the second integrated circuit comprises
  a second package, and
  a third die disposed within the second package.

31. A system, comprising:
a first integrated circuit, comprising
  a first die,
  a transmitter disposed on the first die,
  a transmit antenna disposed on the first die and coupled to the transmitter,
  a second die,
  a receiver disposed on the second die, and
  a receive antenna disposed on the second die; and
a second integrated circuit coupled to the first integrated circuit;
wherein the first die and the second die are arranged on top of one another and galvanically isolated from one another by an isolating layer arranged between the first die and the second die; and
further comprising:
a package;
  wherein the first and second dies of the first integrated circuit are disposed within the package; and
  the second integrated circuit comprises a third die disposed within the package.

32. A method, comprising:
generating a signal on a first die in an integrated circuit including the first die and a second die, and the first die includes a transmitter, the second die includes a receiver wherein the transmitter and the receiver are arranged on top of one another and galvanically isolated from one another by an isolating layer;
transmitting the signal via a transmit antenna disposed on the first die; and
receiving the transmitted signal with a receive antenna disposed on the second die.

33. The method of claim 32 wherein transmitting the signal comprises transmitting the signal within a package enclosing the first and second dies.

34. The method of claim 32, further comprising:
generating a common-mode-rejection compensating current; and
coupling the compensating current to the receive antenna.

35. The method of claim 32 wherein transmitting the signal comprises transmitting the signal from the transmit antenna, through at least one of the first and second dies, to the receive antenna.

36. The method of claim 32 wherein transmitting the signal comprises transmitting the signal from the transmit antenna, through a region between the first and second dies, to the receive antenna.

37. An integrated circuit, comprising:
a first die;
a receiver disposed on the first die;
a receive antenna disposed on the first die and coupled to the receiver;
a second die;
a transmitter disposed on the second die, wherein at least a portion of the transmitter is disposed on top of at least a portion of the receiver;
a transmit antenna disposed on the second die; and
an isolator disposed between the first die and the second die.

* * * * *